United States Patent [19]

Leney et al.

[11] 4,123,750
[45] Oct. 31, 1978

[54] SIGNAL PROCESSOR FOR POSITION ENCODER

[75] Inventors: David E. Leney, Westford; Robert W. Stuart, Bedford; John S. Anderegg, Carlisle, all of Mass.

[73] Assignee: Dynamics Research Corporation, Wilmington, Mass.

[21] Appl. No.: 420,222

[22] Filed: Nov. 29, 1973

[51] Int. Cl.² ............................................. H03K 13/02
[52] U.S. Cl. .................................. 340/347 P; 364/107
[58] Field of Search ......... 340/172.5, 342 AD, 347 P, 340/147 MT; 235/92 MP, 92 CV; 250/231 SE; 364/107, 108, 110

[56] References Cited

U.S. PATENT DOCUMENTS

| 3,648,175 | 3/1972 | Barnard et al. | 324/115 |
|---|---|---|---|
| 3,701,145 | 10/1972 | Bergin | 340/347 NT |
| 3,708,657 | 1/1973 | Kelling | 235/92 MP UX |
| 3,727,037 | 4/1973 | Zorn | 235/150.53 |
| 3,731,302 | 5/1973 | Neer | 340/347 AD |
| 3,745,562 | 7/1973 | Rosenbaum | 340/347 AD |
| 3,757,306 | 9/1973 | Boone | 364/200 |
| 3,764,781 | 10/1973 | Kreithen et al. | 235/92 MP |
| 3,824,585 | 7/1974 | Meijer | 340/347 AD X |

OTHER PUBLICATIONS

Intel MCS-4 Micro Computer Set, Intel Corporation, 1/1972, pp. 1-12.

Primary Examiner—Thomas J. Sloyan
Attorney, Agent, or Firm—Weingarten, Maxham & Schurgin

[57] ABSTRACT

A signal processor for an incremental encoder to provide output signals representing absolute position in any of a plurality of selectable scales and formats. In particular, incremental pulse signals from an incremental encoder are applied to a dedicated digital processor which is controlled by a read-only-memory to operate on the incremental input signals in a predetermined sequence of operations with associated logic units. To provide different output formats and scale factors, different processing of the incremental signals is provided by the same or different read-only-memory provided for operation with the system.

10 Claims, 15 Drawing Figures

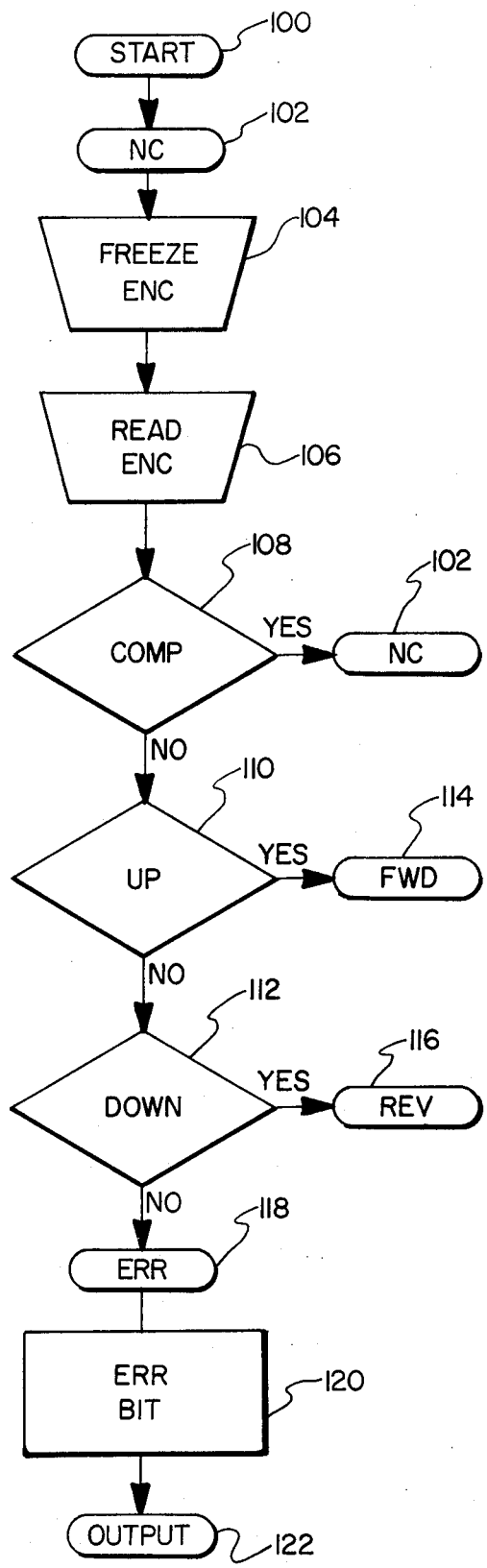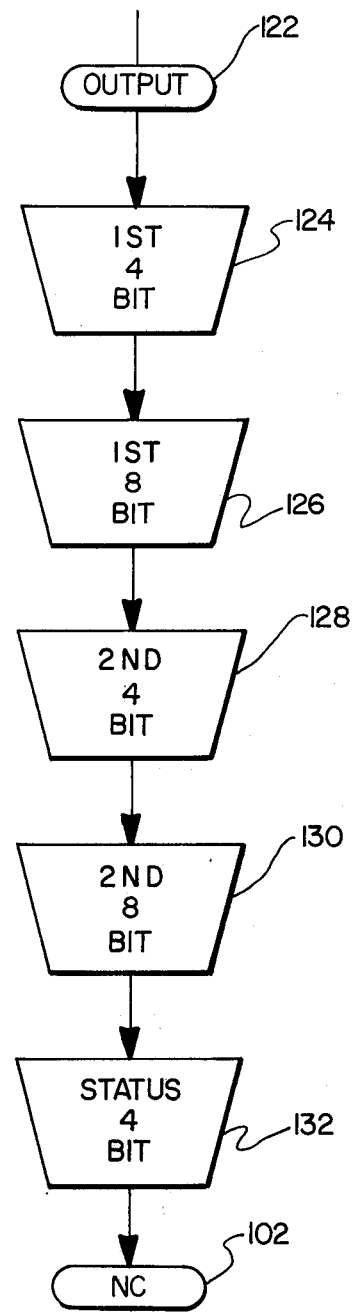
FIG. 4A
FIG. 4B

SIGNAL PROCESSOR FOR POSITION ENCODER

FIELD OF THE INVENTION

This invention relates to encoder signal processing circuitry and in particular to a signal processor for an incremental encoder to provide absolute position information in selectable formats.

BACKGROUND OF THE INVENTION

Currently absolute or direct reading encoders that can convert rotary or linear motion into a digital word representing absolute angular position are well known and readily available. They have the valuable property that the encoder operating power can be removed without loss of the record of absolute position since it is carried by the encoder itself. In providing this function, absolute encoders require a great many parallel scales, the exact number depending upon the range and accuracy requirements. This large number of scales in the electro-optical reading heads for absolute encoders makes them more delicate in field applications as well as somewhat less reliable. In many applications, the ruggedness and reliability are more important features than the inherent memory capability of the absolute encoder.

Incremental encoders which provide an output indication of each elemental change in angle or position are known in combination with circuitry which senses amount and direction of motion and accumulates these indicia in order to provide an indication of absolute position. Typically, a zero reference is also provided with such a system to reset the circuitry at a predetermined angular or linear position to prevent perpetuation of errors.

SUMMARY OF THE INVENTION

In a preferred embodiment of the present invention, an incremental encoder provides signals representative of elemental motion to a signal processor under the control of interchangeable read-only-memories to provide an output indication of absolute position. The read-only-memory controls a micro-processor within the processing electronics in order to provide output data representing angular or linear position in radians, degrees or other measures and identifying specific angular or linear ranges. It is thus possible to design a universally useful encoder, with specific customer requirements provided by the simple expedient of fabrication of a different memory to control the micro-processor operation in accordance with those requirements.

The output digital signals can also be provided in any format desired for interfacing with any specific requirements of utilization equipment with which the encoder may be associated. This format may also be readily changed by the simple exchange of a read-only-memory without requiring the rebuilding of the encoder processing electronics.

In addition, encoder reliability is greatly enhanced by using an incremental encoder while at the same time the advantages of an absolute encoder are provided. Memory for the absolute position may be readily provided by the use of emergency battery power for operating necessary components of the processing circuitry. A further benefit of this system is a great increase in noise margins thereby reducing noise sensitivity of the encoder system, and the cost of the encoder is generally substantially less than that associated with an equivalent absolute encoder.

BRIEF DESCRIPTION OF THE DRAWINGS

These and other features of the present invention will be more fully understood by reference to the detailed description of the preferred embodiment, presented below for purposes of illustration and not by way of limitation, and to the accompanying drawings of which:

FIG. 3 is a graph of system output values useful in describing the operation of the invention;

FIGS. 4A-4H illustrate the operation of the processing circuitry of FIG. 2 in a preferred embodiment of the present invention;

DETAILED DESCRIPTION OF THE PREFERRED EMBODIMENT

The preferred embodiment of the present invention contemplates an encoder system wherein the electrical output of an incremental encoder is processed by a transformation circuit to provide an absolute position output in selectable digital formats and scales as well as plural cam indications. Rather than employing a conventional digital logic circuit designed to provide that format, scale and cam function, a digital processor is built around a replaceable memory of process instructions, to provide flexibility in the system through the capacity to readily change format, scale factor or cam indications. A particular ordering of processing functions establishes sufficient processing speed not found in general purpose processors to respond to each encoder motion.

Figure 1:
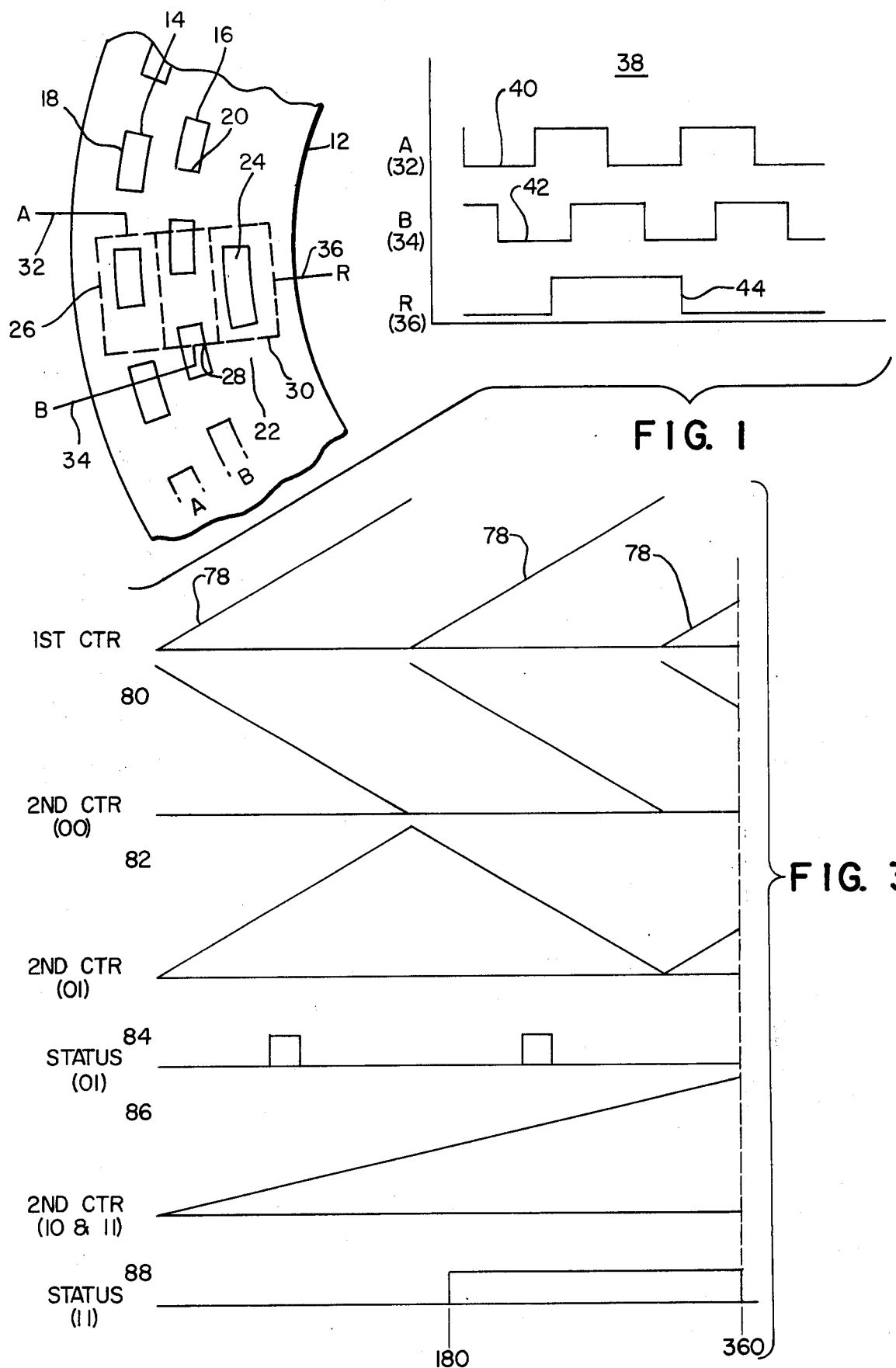
FIG. 1 is a partial view of an incremental encoder with which the processing circuitry of the present invention may be utilized.

A portion of an exemplary incremental encoder for use in the invention is shown in FIG. 1 and comprises a disc 12 having first and second patterned bands 14 and 16 with alternate, typically equal duration opaque markings 18 and 20, respectively, offset by approximately 90° from each other in phase to enable sensing of the direction of motion, as well as elemental changes in position. A third band 22 is typically provided with a marking 24 to indicate a predetermined reset point in the revolution of the disc 12. Electro-optical sensors 26, 28 and 30 are provided to sense the presence of each of the markings 18, 20 and 24 to provide an output indication on respective output lines 32, 34 and 36 (labelled A, B and R). A typical representation of the output pattern on these respective lines is shown in a graph 38 showing squarewave patterns 40 and 42 for the respective outputs 32 and 34 with a 90° phase difference between them and a single squarewave pulse 44 representative of the reset signal generated once per revolution of the encoder. The encoder may also operate with a single band of information and having sensors placed along the band with a 90° phase difference between them. Operation is equivalent in either case.

While shown for use with an encoder for angular position sensing, it is clear the encoders for other, specifically linear, motion sensing may be used in the invention as well as encoders having a different output format.

For sensing the direction of motion of the encoder having the sequence of graph 38, a clockwise sequence is indicated as the logic condition $\overline{Ba}+Ab+\overline{Ba}+\overline{Ab}$. The counterclockwise sequence designated as $\overline{Ab}+\lambda \overline{Ba}+A\overline{b}+Ba$. Here capital letters designate magnitudes (logic 1 if unbarred, 0 if barred) and small letters designate transitions (positive if unbarred and negative if barred).

Figure 2:
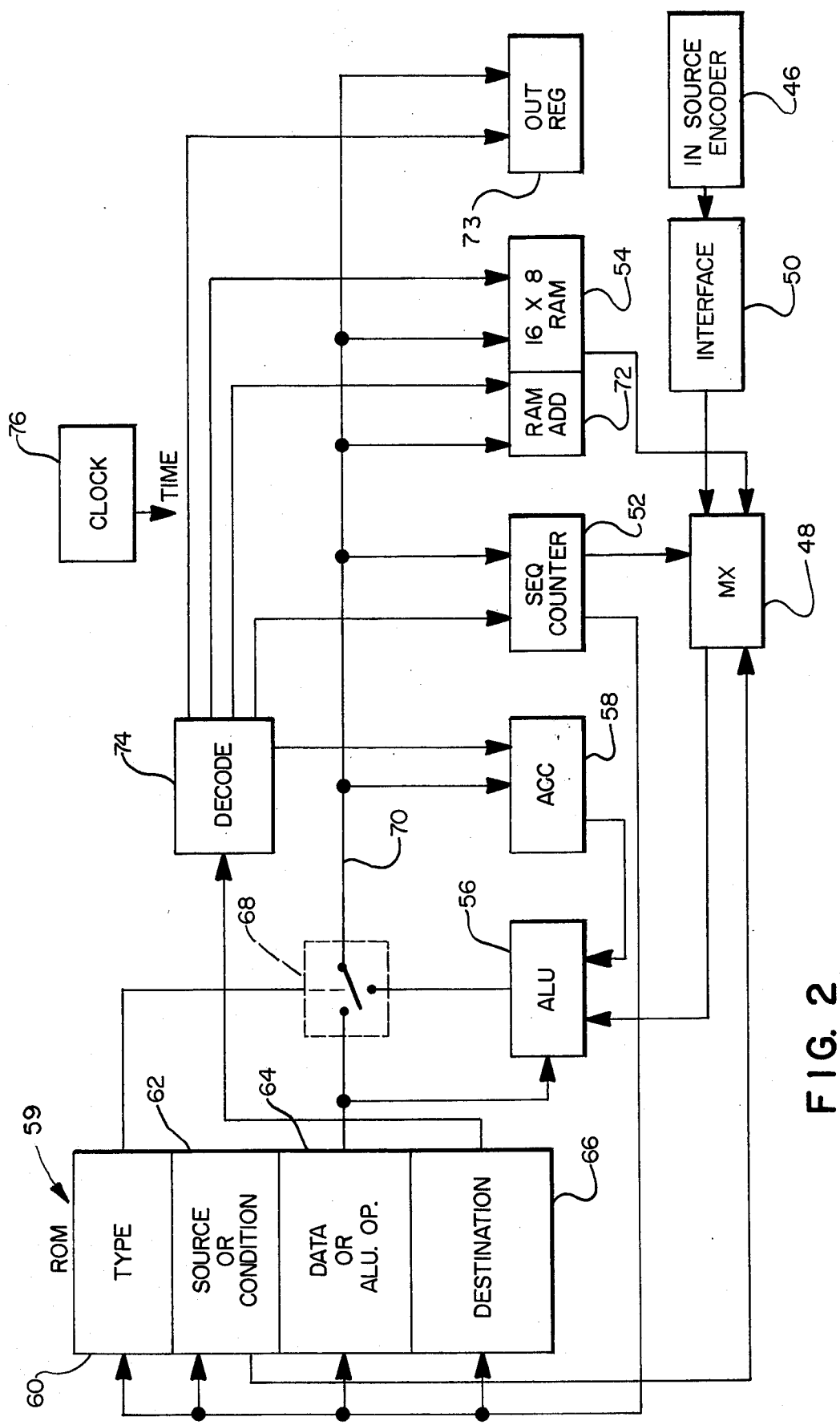
FIG. 2 is a block diagram of processing circuitry for the encoder output for use in the present invention.

Referring now to FIG. 2, a block diagram of the processing circuitry for the output of the encoder is shown. In particular, a source 46, typically the encoder, is shown and has its outputs, which may be the lines 32, 34 and 36, applied as one set of inputs to a multiplexer 48 through interface unit 50 which partially implements the direction sensing algorithm illustrated above and shown in further detail below with respect to FIG. 6. Additional inputs to the multiplexer 48 are provided from a sequence counter 52 and from a random access memory 54. The output of the multiplexer 48 is directed toward an arithmetic logic unit 56 on one input thereof. The second input of the arithmetic logic unit 56 is provided from an accumulator register or latch 58. The multiplexer 48 is controlled for source selection by a signal from a matrix read-only-memory controller 59. The memory controller 59 may be viewed as having four control data sections for each address: a first portion 60 indicating a signal processing step type; a portion 62 controlling multiplexer 48 for data applied to the arithmetic logic unit 56 to produce a transformation in data thereby (adding, shifting, scaling, comparing, etc.); a portion 64 containing data or arithmetic logic unit operation; and a portion 66 of data destination codes. An output for each of the portions 60, 62, 64 and 66 is uniquely defined by an address input from the sequence counter 52 to the memory controller matrix which in turn provides at the corresponding outputs a high or low signal corresponding to the recorded bits at a corresponding intersection within the ROM matrix 59.

The output from the portion 60 controls a data switching unit 68 to apply data from the portion 64 or the arithmetic logic unit 56, depending upon its state, to a data bus 70 which is connected to the accumulator 58, sequence counter 52, random access memory 54 (including a random access addressing portion 72) and finally an output register 73. The appropriate unit coupled to the data bus 70 which is to receive the data is activated to respond to the information on the bus 70 by a signal from a decoder network 74 which responds to destination codes from the destination portion 66 of the read-only-memory 59.

A clock 76 is provided in this system to sequence the entire processing circuitry of FIG. 2 through the sequence of states which are employed to digitally process all data provided from the input source 46. The clock 76 therefore operates at a sufficient rate to process each encoder data change before a further change in that data occurs from encoder motion. The particular set of operations is defined by the characteristics of the matrix of the read-only-memory 59 and may be changed readily by the insertion of a differently coded read-only-memory.

As an indication of the flexibility which is provided by such a system, FIG. 3 illustrates a set of possible output values for the system over 360° of encoder motion in a rotary encoder. A first graph 78 shows a representation of the value represented by the contents of a first counter or register which may be included as two registers within the random access memory 54 and contains the basic information as processed from the output of the encoder. It will be noted that the value of this signal increases linearly with angle through approximately 2½ cycles for each revolution of the encoder. The 2½ cycles results from the particular digital capacity of the binary elements used in the present system. A graph 80 represents the value of the contents of a second counter or register which may be an additional two registers within the RAM 54 in a first case labelled (00) of a particular transformation of the signal output of the first counter. It is apparent that the result of the first transformation of the basic data in the first counter provides an opposite slope signal pattern commencing in a high and terminating in a low value. In a second case designated (01), the second counter or register has a digital representation of the results of a further transformation which is shown by a graph 82 as having linked curves of alternating slopes. In addition, a status register contains a value, shown in graph 84, marking predetermined angular or magnitude positions in the encoder rotation. The signal shown in graph 84 thus corresponds generally to the format of signal that would typically be provided by mechanical or electro-optical cams or their equivalent in the encoder itself. Finally, a graph 86 represents the value of the contents of the second counter or register after a yet further transformation which is the same for both cases (10) and (11). This transformation provides a change in scale factor. The corresponding waveform is a continuous and linearly increasing representation over the entire 360° portion. Used in conjunction with the signals represented by any of the above graphs 78, 80 or 82, it also provides an interpolation between the repeating portions of those signals. A final graph 88 represents the value of the contents of the status register to designate one-half of the encoder scale from the other by a transition at 180° as shown.

It is, of course, apparent that other transformations on the basic input signal may be employed to provide any series of output signals, scales, or marking signals to indicate specific portions of the encoder range.

Figure 4C:
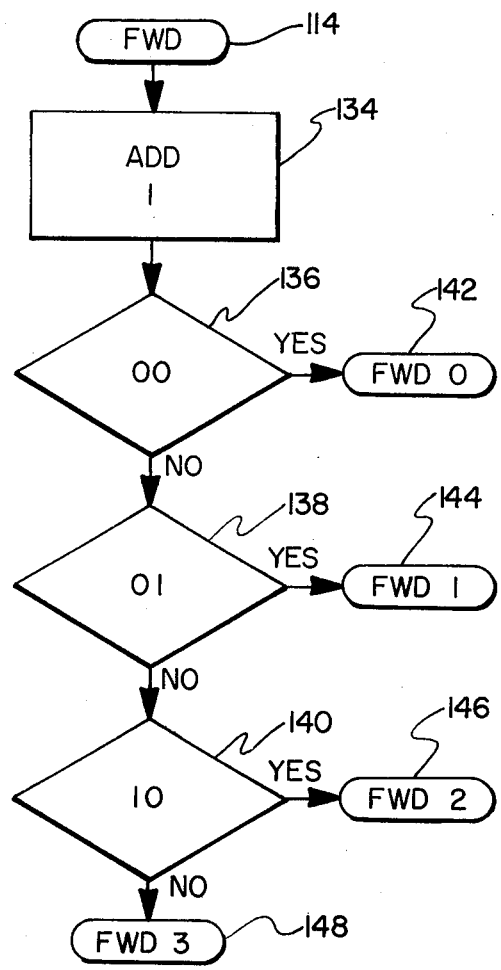

The sequence of steps which govern the operation of the FIG. 2 signal processor for producing the appropriate transformations to the received signal from the incremental encoder are illustrated in a set of detailed, step-by-step diagrams in FIGS. 4A–4H. With reference to FIG. 4A, sequencing begins at a START position 100. Subsequently, a no change state 102 is automatically entered. A subsequent input-output operation 104 strobes the encoder to "freeze" a new set of values from the encoder to prevent changes in encoder output signals during the subsequent step 106 which reads the encoder values to a designated memory area in the random access memory 54. A subsequent decision step 108 compares the new value from the encoder against the previous value in the RAM 54. If no change is indicated, processing returns to the no change step 102 while if there is a change, a further sequence of comparisons is conducted including a decision 110 and subsequent decision 112 which tests for a change by one elemental encoder value in an up or down direction, respectively. If in the decisions 110 or 112 either an up or down change of one value is detected, processing advances respectively to forward and reverse states 114 and 116 described below. If none of the tests 108, 110 or 112 result in a positive determination, an error state 118 is entered and in sequence a step 120 which sets a bit in the appropriate location of the status register in output register 73 indicative of malfunction. Subsequently, processing advances to an output state 122 from which, as described in FIG. 4B, a sequence of input-output commands are generated.

At this point, some background information in the particular architecture of the data processing in the present processor is useful. First, the sequencing through the steps of FIGS. 4A–4H is established with sufficient speed to be completed, in the worst case, sufficiently fast to insure that no more than one elemental value change in the output of the encoder is possible. This essentially means the encoder response speed is slow with respect to the cycle time of the processor. This rapid cycle time results from the processing chain of events more particularly described in FIG. 5.

In addition, due to the capacities of the units employed in the exemplary processor of the present invention, no more than eight bits are operated upon at a single time. In order to provide 12 bit accuracy, a single piece of 12 bit data requires two sequential steps, one of eight bits and one of four bits. As a result in FIG. 4B, the sequence of output commands include first and second commands 124 and 126 which output to a first output counter or register, respective four and eight bit data words. As will be indicated below, the first counter will contain signals processed in correspondence with the graph 78 in FIG. 3. Subsequent output commands 128 and 130 output to another second counter respective four and eight bit data words and a final output command 132 outputs to a status register within the output register 73 four status bits including indications of the error condition as well as the specific indications of cam selections within the encoder range as shown in graphs 84 and 88. Processing then returns to the no change state 102.

The manner in which the first and second counters or registers within the output register 74 are loaded with the appropriate data are illustrated in the sequences of FIGS. 4C–4H. In particular, in FIG. 4C, the transition through the forward state 114 leads to a step 134 which adds to the first counter in the RAM 54, one bit representing an elemental angular change in the forward or up direction of the encoder. This adds one to the first counter within the RAM 54. Subsequently, the specific transformation for states 00, 01, 10 or 11 is provided by testing switches shown in FIG. 6 as a part of the signal from interface 50 to determine which of the four possible states have been selected by the operator. This is accomplished by decisions 136, 138 and 140 in sequence which respectively test for the 00, 01 and 10 cases and if found respectively lead to forward 0, forward 1 and forward 2 states 142, 144 and 146. A negative determination on the final decision 140 leads, by process of elimination, to the forward 3 state 148 corresponding to case 11.

Figure 4D:
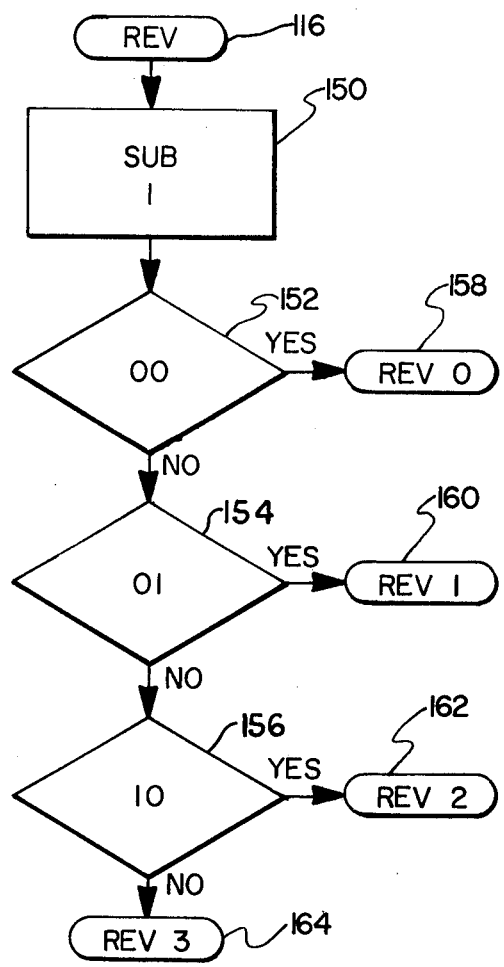

In FIG. 4D, a similar sequence for the reverse state 116 comprises a step 150 which subtracts one least significant bit from the first counter in the random access memory 54 and leads to a sequence of decisions 152, 154 and 156 which test, respectively, the states 00, 01, 10 and 11 (by process of elimination) and which lead to reverse 0, reverse 1, reverse 2 and reverse 3 states 158, 160, 162 and 164 respectively.

Figure 4E:
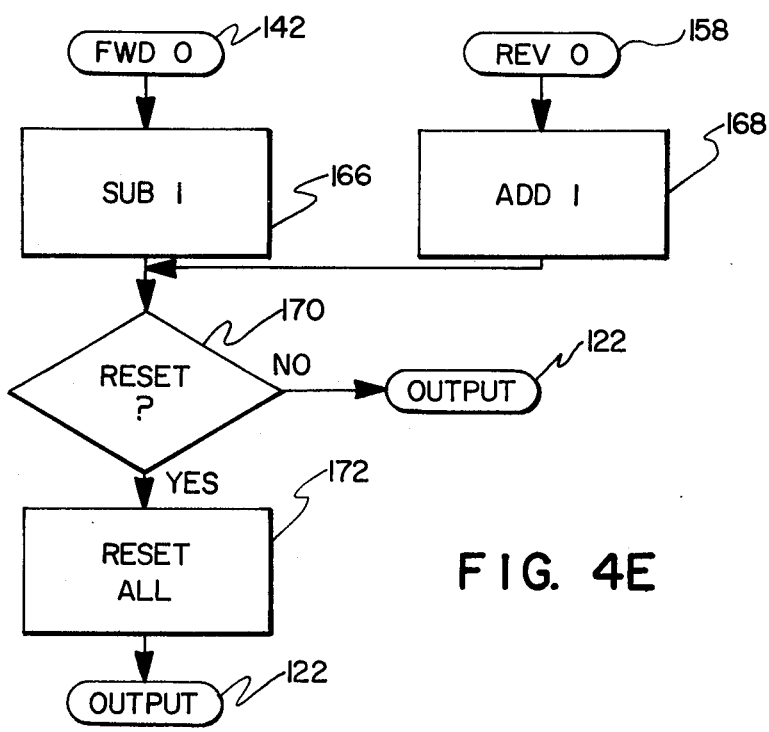

In FIG. 4E, the sequencing entered by the forward 0 or reverse 0 states 142 and 158 are illustrated. From those states further steps 166 and 168, respectively, add or subtract one least significant bit to or from the second counter, two registers within the random access memory 54. After either step 166 or 168, a decision 170 tests for the presence of a signal on the line 36 indicating the zero reference reset position of the encoder. If this reset signal does not exist, the output step 122 is entered whereas if the zero reference reset signal is present a step 172 resets all counters in the random access memory 54 before proceeding to the output step 122. In either case, the output sequence after step 122 will extract from the first and second counters respective four and eight bits of data for loading in the output register 74 at corresponding locations where they are available for utilization equipment. As can be seen, the operation of steps 166 and 168 is opposite to steps 134 and 150 so that the second counter indication will correspond to the graph 80 in FIG. 3.

Figure 4F:
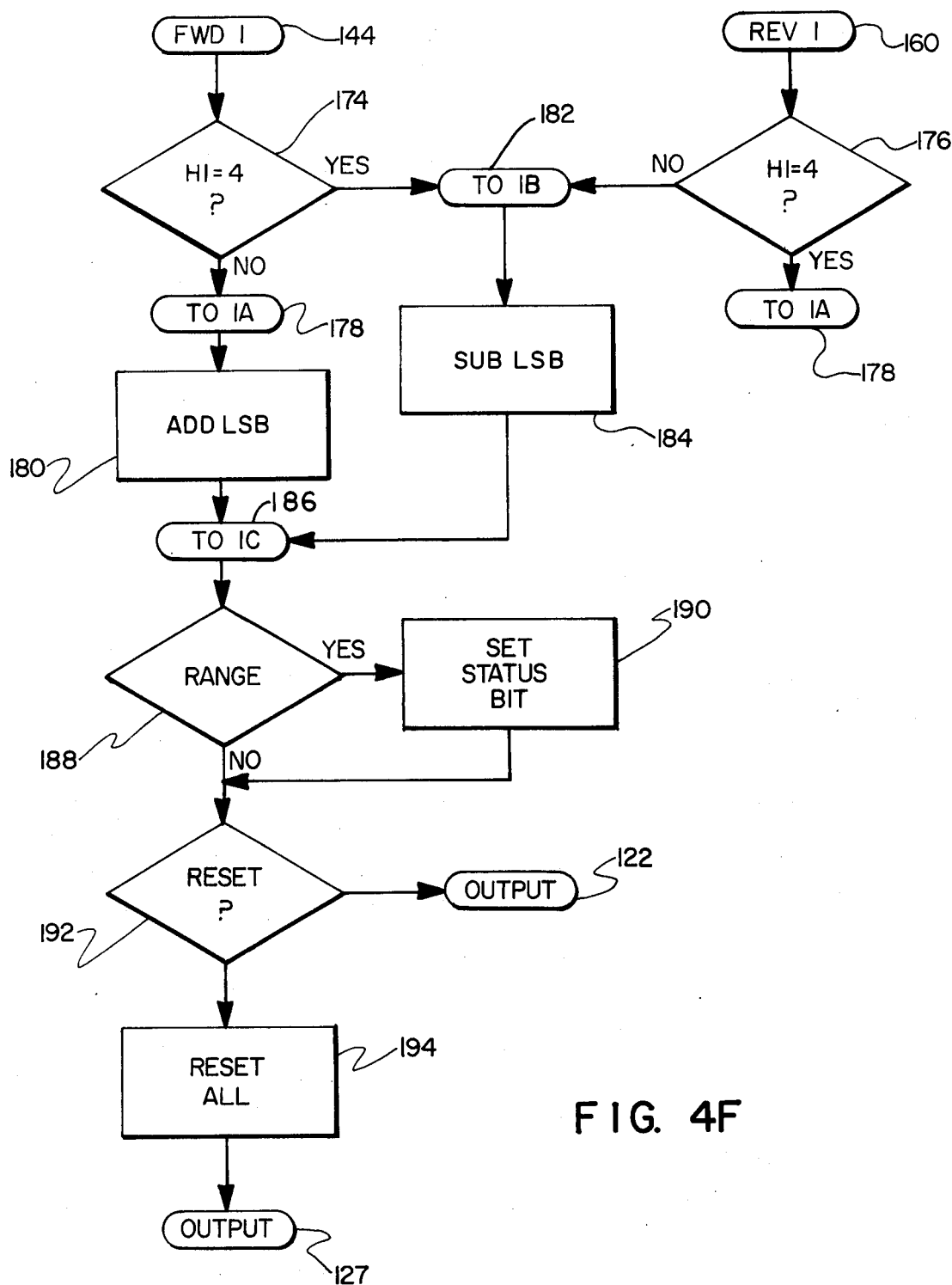

With respect to FIG. 4F, the sequencing from both the forward 1 and reverse 1 states 144 and 160, corresponding to graph 82, is illustrated. From the steps 144 and 166, decisions 174 and 176 are made to test the high order bits in the first counter for maximum capacity. If, in decision 174, they are not at maximum or in decision 176 they are at maximum sequencing continues through a step 178 to a step 180 which adds a least significant bit to the second counter. In correspondence with diagram 82, this insures that for decreasing angles in the second cycle portion of the first counter in graph 78 and that for increasing angles in the first cycle portion of graph 78 the second counter is augmeted to provide the linked curve of graph 82. Similarly, when the results of decisions 174 and 176 are respectively positive and negative, processing continues through a step 182 to a step 184 which subtracts a 1 from the second counter in the random access memory 54. Processing from either steps 180 or 184 continues through a step 186 to a decision 188 which tests for the value in the first counter indicative of angular position to determine whether the encoder is within one of the selected ranges illustrated in diagram 84 which requires the setting of a marker bit in the status register of RAM 54. If the test is affirmative, a step 190 sets the corresponding bit in the status memory location of the random access memory and branches, along with a negative determination from the decision 188 to a decision 192 and, sequentially, step 194, which repeat the operation of decision 170 and step 172 in FIG. 4E.

Figure 4G:
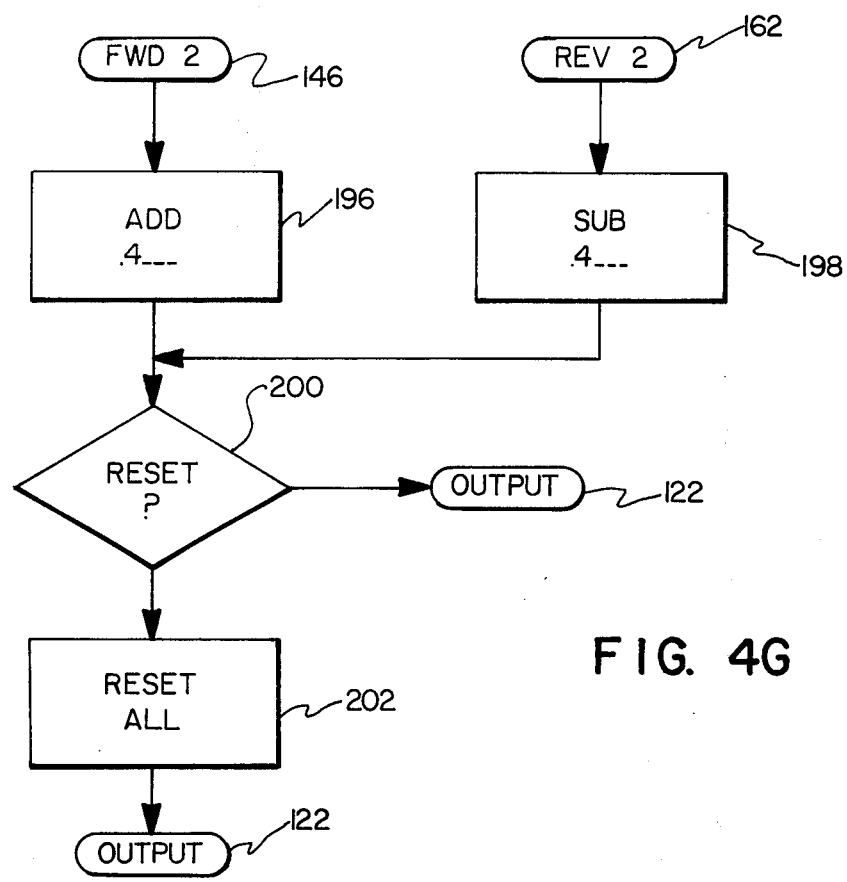

In FIG. 4G, the sequence of events under the forward 2 or reverse 2 steps 146 and 162, respectively, are illustrated. From each step, respective further steps 196 and 198, respectively, add and subtract a decimal value 0.410156 in binary notation from a random access memory area of higher capacity and of greater precision. It will be noted from the waveform 86 in FIG. 3 that scale is changed for the transformation of this operation by reducing the slope approximately by a factor of 2.5. Accordingly, a change of less than a bit in the least significant place for the second counter is selected, the specific decimal value indicated above being used. Subsequent to the steps 196 and 198, a decision 200 and subsequent step 202 are executed corresponding to the decision 170 and step 172 of FIG. 4E.

Figure 4H:
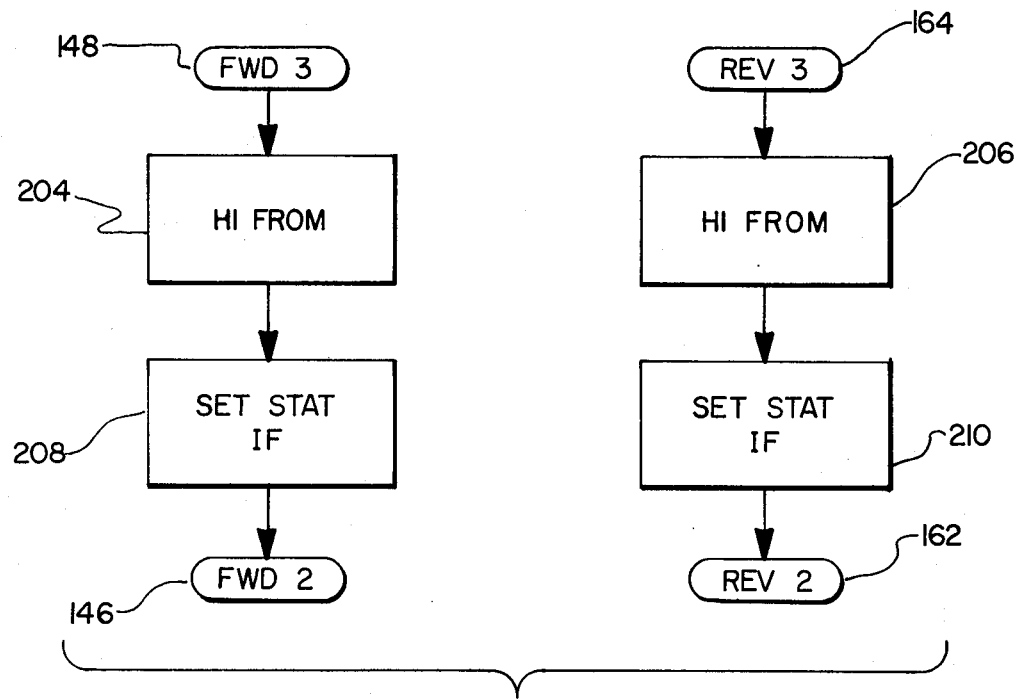

In FIG. 4H, the sequencing under the forward 3 and reverse 3 states are illustrated and respectively comprise alternate steps 204 and 206 which obtain the highest order bit of the second counter in the random access memory 54 and, in subsequent steps 208 and 210 respectively, use that bit to set a 180° range indicating bit in the status register in the random access memory for output to the status output register in register 74. Sequencing then branches respectively from the two paths in FIG. 4H to the forward 2 and reverse 2 states 146 and 162 respectively.

The above description serves to illustrate the structure and operation of the invention. To further illustrate the exact details of the structure for the preferred embodiment, FIGS. 5-8 are provided to show a complete component implementation for the system.

Figure 5:
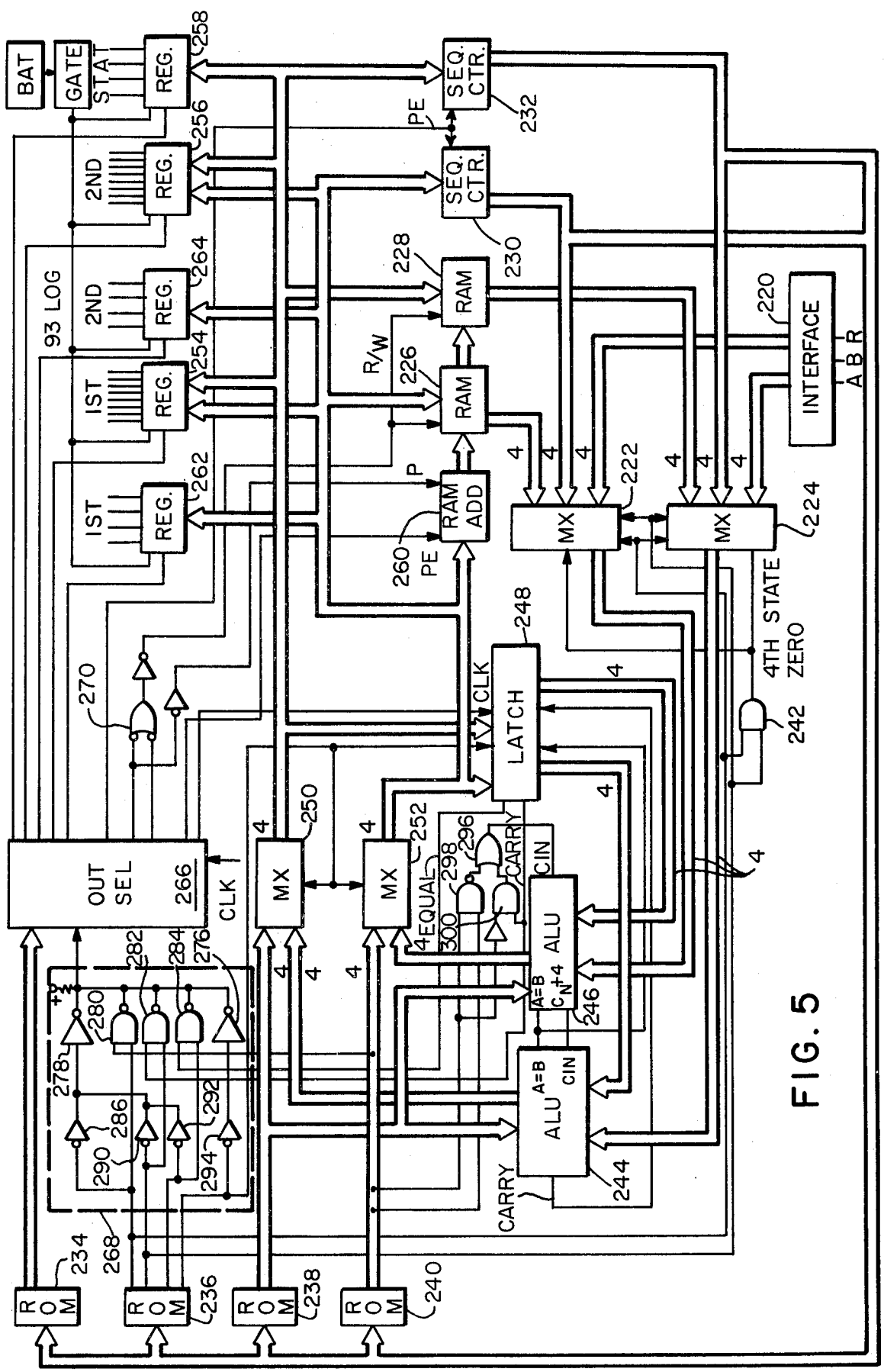
FIG. 5 is a detailed circuit diagram of the components of the processing circuitry of the present invention.

Turning now to FIG. 5, there is shown a complete diagram of components which may be utilized to provide the indicated, selectable transformations on the encoder output in accordance with the present invention. In particular, signals from the encoder are applied through an interface circuit 220 more fully described in FIG. 6 on the three lines indicated in FIG. 5. Two four-bit parallel outputs from the interface 220 (including the case designating code) are applied to respective multiplexer units 222 and 224 which may typically be an integrated circuit (IC) model type 8263. The two four-bit inputs are described with respect to FIG. 6. Each multiplexer 222 and 224 has two other four-bit parallel inputs respectively from the random access memory registers 226 and 228 and counters 230 and 232 which are applied as shown. The RAM memory registers 226 and 228 may typically be IC model 31L01 registers and the counters 230 and 232 may be model 93L16 units. The four-bit parallel outputs of the counters 230 and 232 are also applied as addressing controls to each of four read-only-memory matrices 234, 236, 238 and 240 to define which memory locations are applied to the outputs of the read-only-memories. These ROMs may in actual implementation be portions of a single large ROM. Separate ROMs are shown for clarity of the description. Each read-only-memory 234, 236, 238 and 240 has four-bit parallel outputs which are applied throughout the circuitry of FIG. 5 for control purposes. In particular, the first two-bit signals from the memory 236 are applied to control the multiplexers 222 and 224 for selection of one of the three sets of parallel inputs. An AND gate 242 detects the fourth (11) state on these lines to provide a zero output from the multiplexer in that state.

A four-bit parallel output from each multiplexer 222 and 224 is applied to respective arithmetic logic units 244 and 246 which may typically include IC model 54L5181193L41 ALUs. A second input to the arithmetic logic units 244 and 246 are two respective four-bit parallel lines provided from a latch circuit 248, typically a model 8202 providing the function of an accumulator register. The arithmetic logic units 244 and 246 are controlled by the four-bit parallel outputs of the read-only-memory 238 applied to each unit on respective S0, S1, S2 and S3 inputs to determine the function among the 16 possible functions designated by those control inputs which the arithmetic logic units are to perform on their two data inputs.

The outputs of the arithmetic logic units 244 and 246, two four-bit parallel signals are applied to respective multiplexers 250 and 252. Models 93L22 may be used. A second input to the multiplexers 250 and 252 is provided respectively from the read-only-memories 238 and 240 for specific data contained in the memories such as, for example, constants to be applied to the arithmetic logic units 244 and 246 for use in the calculations through those units. The multiplexers 250 and 252 are controlled by the last bit output of the read-only-memory 236 to determine which of the two sets of four parallel inputs are selected.

The outputs, four-bit parallel, of the multiplexers 250 and 252 are applied to storage and output registers within the system. In particular, the four-bit parallel output of the multiplexer 250 is applied to second and fourth eight-bit registers 254 and 256 (first and second output registers) as well as a four-bit status register 258, the sequence counter 232, RAM 228 and latch 248. The output of the multiplexer 252, four-bit parallel, is applied on parallel inputs to the latch circuit 248 and to the random access memory address circuit 260 as well as to the random access memory 226 and counter 230, and the first and second output registers 254 and 256, and also additional four-bit first and second output registers (typically half of an eight-bit register) 262 and 264 to complete the 12-bit output. The registers 254, 256, 262 and 264 may typically be models 93L08 while the register 258 may be a model 93L14. The random access memory addressing circuit 260 may include a type 93L16 register.

While the data or control output of the multiplexers 250 and 252 is available on the respective output buses to all output registers, memories and counters to which they are directed, the particular register which will respond to the data on that line is determined by the clock output of an output select circuit 266 or decoder which may typically be a model 93L11. This unit responds to the four-bit parallel output of the random access memory 234 as well as the four-bit parallel output of the random access memory 236 through a logic unit 268, which outputs a single conditional execution control to the output select circuit 266 to enable output selection or read/write control at its outputs. The outputs of the circuit 266 are clock signals from a clock (CLK) input thereto. The first five-bit outputs of the output select unit 266 are selectively gated clock signals applied respectively to the output registers 258, 256, 264, 254 and 262 to enable them to respond to the parallel four-bit outputs of the appropriate multiplexers 250 and 252. Of the last five-bit selectively gated clock signals from the select circuit 266 (the intermediate 6 not being used), the first is applied as a PE (parallel enable) control for the sequence counters 230 and 232. The next two outputs are OR'd in a gated 270 and inverted for application as the read/write controls to the random access memories 226 and 228. Of these two signals from the select unit 266, the first is inverted and applied as the P control to the random access memory addressing circuit 260. The PE control for circuit 260 is provided from the next to last output of the select unit 266, while the last output is applied to the clock input of latch circuit 248. The logic unit 268 provides an output to the output select unit 266 at the junction of output signals from inverters 276 and 278 and AND gates 280, 282 and 284. The inverter 278 responds to the first output of the ROM through an inverter 286 as well as the second and third outputs through inverters 290 and 292 having joined outputs. The AND gate 280 has one input from the first bit output of ROM 236 and the second input from the third bit output of the ROM 240. The AND gate 282 responds to the second bit output of the ROM 236, as well as the carry output of the latch circuit 248. The AND gate 284 responds to the third bit output of the ROM 236, as well as the equal indicating output of the latch circuit 248. The inverter 276 responds through a further inverter 294 to the final bit output of the ROM 236.

The carry input of the arithmetic logic unit 246 is provided from an OR gate 296 which, in turn, responds to inputs from an inverting AND gate 298 and an AND gate 300. The AND gate 298 responds to the second and third bit outputs of the ROM 240 while the AND gate 300 responds to the carry output of the latch circuit 248 and, through an inverter, to the third bit output of the ROM 240. The carry input of the arithmetic logic unit 244 is provided from the carry output of the arithmetic unit 246. The outputs of the arithmetic logic units 244 and 246 indicating equality between the two respective inputs and indicating a carry are applied for storage to respective bit locations of the latch circuit 248 which provides an equal output signal and a carry output signal to logic 268 in order to permit processing of a 12-bit word as sequence of four and eight-bit words without using greater than eight-bit components.

Figure 6:
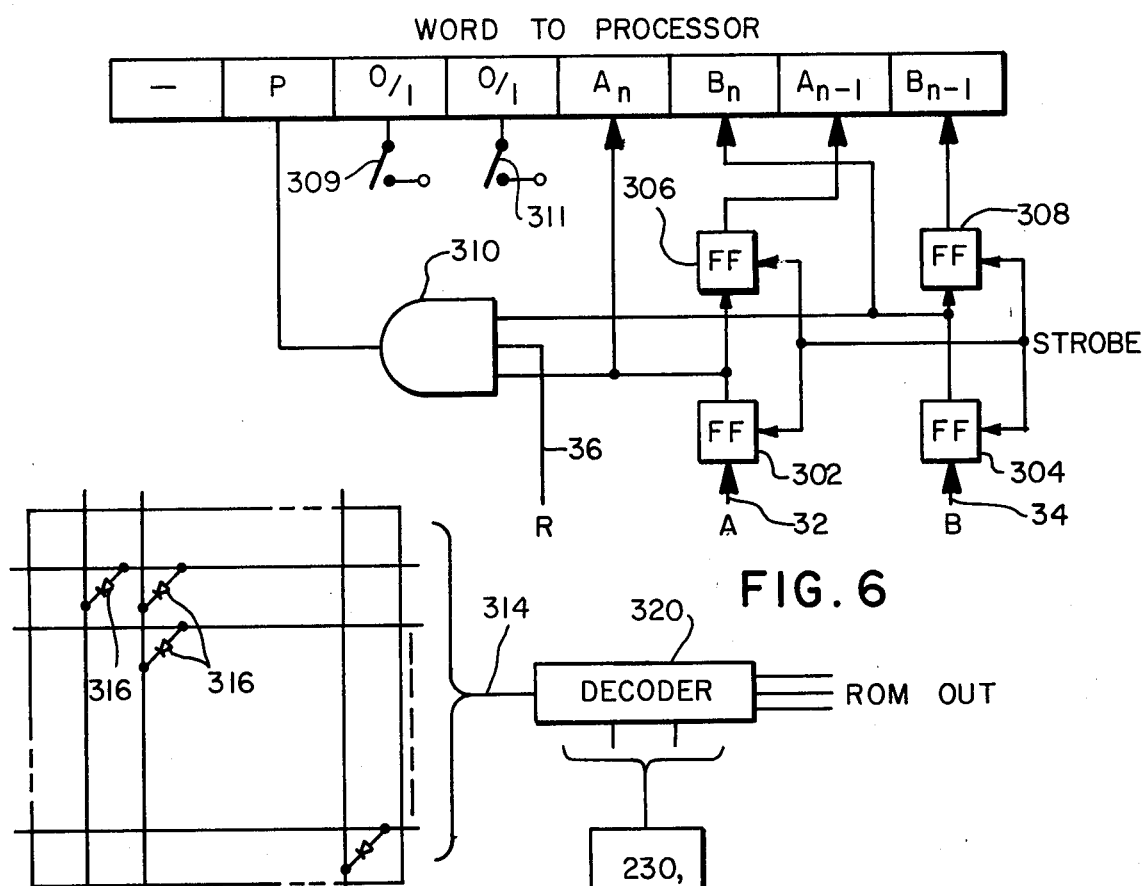
FIG. 6 is a diagram of circuitry used for encoder motion direction sensing in the invention.

With reference now to FIG. 6, there is shown structure of the encoder interface 220 which provides the two four-bit parallel outputs coded to indicate elemental units of motion as well as to provide the information for a determination of direction of motion. The signals on lines 32 and 34 from the encoder are applied to first respective flip-flops 302 and 304 and sequentially to a second stage of flip-flops 306 and 308 in order to provide storage of two sequential strobe intervals. The outputs of the flip-flops 306 and 308 are applied as two bits of the input data to reflect the line 32 and line 34 signals of the previous strobe interval. The outputs of the flip-flops 302 and 304 are applied as further data word inputs to the processor and reflect the current encoder output. An AND gate 310 responds to the outputs of the flip-flops 302 and 304, as well as the reset signal on line 36 to provide a positive indication of reset within a consistent elemental unit of the encoder. For this purpose, the reset marker 24 spans approximately one cycle of the square-wave outputs 40 and 42 in FIG. 1. With this information, the processor of the present invention is readily able to perform the calculations illustrated above to sense direction of motion, specific implementation of this being provided in states 110 and 112 and specified in detail in the table below which defines structure within the ROMs 234, 236, 238 and 240. Two switches 309 and 311 provide logic 1 or 0 signals to the fifth and sixth bits of the word to the processor to define the four cases (00, 01, 10 and 11).

Figure 7:
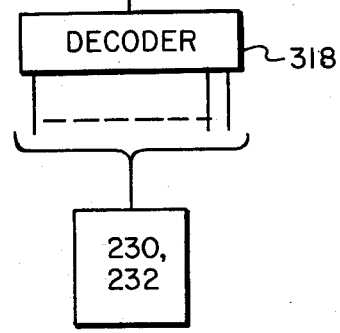
FIG. 7 is a view of a portion of a read-only-memory of the type which may typically be provided for use in the present invention.

For purposes of illustrating the structure of an ROM, reference is made to FIG. 7 illustrating a portion of a conceptual diode matrix. Such matrices may be readily fabricated, and are typically provided on customer order. As shown in FIG. 7, their structure usually includes a set of input address lines 312 and output lines 314. The input address and output lines may be crossed as shown for exemplary clarity and interconnected at each crossing with a diode 316 where, for example, a binary one is wished; the absence of a diode indicates a binary zero. In preferred implementation, TTL logic is employed and a biased transistor replaces each diode. Typically, each ROM in the matrix will be dimensioned into 32 rows by 32 columns. A decoder 318 receives five bits from the counters 230 and 232 to determine which column to activate and a decoder 320 receives the remaining three bits to specify which of eight four bit outputs to provide as the ROM output. Each 16 bit memory outut contains four, four-bit outputs for each ROM 234-240. When one of the input lines 312 is accordingly energized, each of the output lines 314 having a diode or biased transistor at the corresponding intersection will be energized, those without a diode will not be energized, thereby providing a read-out from lines 314 of the status of that portion of the read-only-memory.

Figure 8:
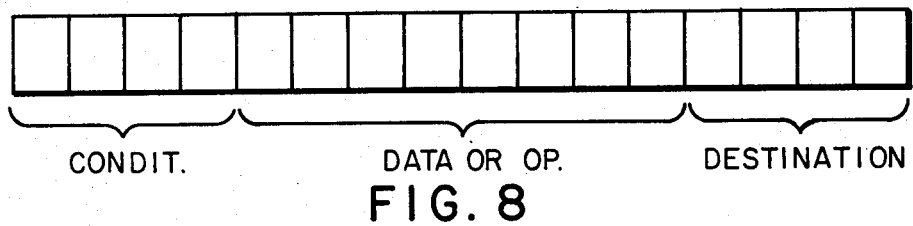
FIG. 8 is a diagram showing the function of each memory bit in the read-only-memory of FIG. 7.

Below is a detailed tabular listing which specifies the points at which diodes are connected (or transistors biased on or off) within a typical read-only-memory to provide the function indicated above in FIGS. 4A-4H. Listed is a sequence of 000 to 377 address locations in octal notation. Beside each contents of the memory address in an indication of the meaning of each of the 16 bits associated therewith. FIG. 8 shows the typical bit meaning for each 16-bit memory address, four from each of the ROMs 234-240. The first four bits (ROM 236) control the source or condition instruction, the first bit thereof indicating the instruction type for control of the multiplexers 250 and 252, the second not being used and the third and fourth defining the source for control of the multiplexers 222 and 224. The subsequent eight bits (ROMs 238 and 240) are employed either for data or, in the first portion of bits, defining the arithmetic logic unit operation. The last four bits (ROM 234) are a code representing the states of the output select unit 266 which decodes these four bits and activates one of the corresponding 10-bit outputs which are employed.

```
DRC ENCODER/MICROPROCESSOR PROGRAM FOR DEMO
THIS PROGRAM USES TWO TEST SWITCHES TO CONTROL THE VARIOUS OUTPUTS
    00 = ONE UP / ONE DOWN - ENCODER SCALE
    01 = UP/DOWN - ENCODER SCALE - BOUNDARY TEST
    10 = SCALED TO 1024
    11 = SCALED TO 1024 - 180 DEGREE BIT
THE PROGRAM USES RAM AS FOLLOWS
00  INPUT VALUE
01  HIGH ORDER REF COUNTER
02  LOW ORDER REF COUNTER
03  FOUR BIT OUTPUT
04  HIGH ORDER OTHER COUNTER
05  LOW ORDER OTHER COUNTER
06  SCALED PORTION OF OTHER COUNTER
07
10
11
12
13
14
15
16
17  TEMPORARY STORAGE
```

| | | PROGRAM ALWAYS STARTS AT ZERO | | | | |
|---|---|---|---|---|---|---|
| 000 | 1000 0001 0000 1011 | STRT 1 | NC | PC | 0000 | - DISPATCH TABLE |
| 001 | 1000 0011 0001 1011 | 1 | REV | PC | 0001 | |
| 002 | 1000 0010 0100 1011 | 1 | FWD | PC | 0010 | |
| 003 | 1000 0001 0101 1011 | 1 | ERR | PC | 0011 | |
| 004 | 1000 0010 0100 1011 | 1 | FWD | PC | 0100 | |
| 005 | 1000 0001 0000 1011 | 1 | NC | PC | 0101 | |
| 006 | 1000 0001 0101 1011 | 1 | ERR | PC | 0110 | |
| 007 | 1000 0011 0001 1011 | 1 | REV | PC | 0111 | |
| 010 | 1000 0011 0001 1011 | 1 | REV | PC | 1000 | |
| 011 | 1000 0001 0101 1011 | .1 | ERR | PC | 1001 | |
| 012 | 1000 0001 0000 1011 | 1 | NC | PC | 1010 | |
| 013 | 1000 0010 0100 1011 | 1 | FWD | PC | 1011 | |
| 014 | 1000 0001 0101 1011 | 1 | ERR | PC | 1100 | |
| 015 | 1000 0010 0100 1011 | 1 | FWD | PC | 1101 | |
| 016 | 1000 0011 0001 1011 | 1 | REV | PC | 1110 | |
| 017 | 1000 0001 0000 1011 | 1 | NC | PC | 1111 | |

| | | READ INPUTS FROM ENCODER AND TEST | | | | |
|---|---|---|---|---|---|---|
| 020 | 1000 0000 0000 1110 | NC | 1 | | 0000 | RADD COMES HERE IF NO CHANGE |
| 021 | 0000 0011 1000 0101 | | 0 | | ZEROS | OUT5 STROBE INPUT |
| 022 | 0001 1111 1000 1101 | | 0 | IN1 | A-ONLY | RAM SAVE WHOLE INPUT |
| 023 | 1000 0000 1111 1111 | | 1 | | 0017 | ACC |
| 024 | 0111 1011 1000 1011 | | 0 | RAM | A-AND-B | PC DISPATCH |
| | | MALFUNCTION DETECT | | | | |
| 025 | 1000 0000 0011 1110 | ERR | 1 | | 0003 | RADD SET BIT 0 |
| 026 | 1000 0000 0001 1111 | | 1 | | 0001 | ACC |
| 027 | 0111 1110 1000 1111 | | 0 | RAM | A-OR-B | ACC |
| 030 | 0000 1010 1000 1101 | | 0 | | B-ONLY | RAM |
| | | OUTPUT ALL VALUES | | | | |
| 031 | 1000 0000 0001 1110 | OUT5 | 1 | | 0001 | RADD |
| 032 | 0111 1111 1000 0000 | | 0 | RAM | A-ONLY | OUT0 4 BITS - 1/2 |
| 033 | 1000 0000 0010 1110 | | 1 | | 0002 | RADD |
| 034 | 0111 1111 1000 0001 | | 0 | RAM | A-ONLY | OUT1 8 BITS - 2/2 |
| 035 | 1000 0000 0100 1110 | | 1 | | 0004 | RADD |
| 036 | 0111 1111 1000 0010 | | 0 | RAM | A-ONLY | OUT2 4 BITS - 1/2 |
| 037 | 1000 0000 0101 1110 | | 1 | | 0005 | RADD |
| 040 | 0111 1111 1000 0011 | | 0 | RAM | A-ONLY | OUT3 8 BITS - 2/2 |
| 041 | 1000 0000 0011 1110 | | 1 | | 0003 | RADD |
| 042 | 0111 1111 1000 0100 | | 0 | RAM | A-ONLY | OUT4 4 BITS - 1/1 |
| 043 | 1000 0001 0000 1011 | | 1 | | NC | PC GO GET NEXT INPUT |

| | | UPDATE REF COUNTER AND DISPATCH TO TEST CASE | | | | |
|---|---|---|---|---|---|---|
| 044 | 1000 0000 0010 1110 | FWD | 1 | | 0002 | RADD LOW ORDER PART |
| 045 | 0111 0000 0010 1111 | | 0 | RAM | A-ADD-1 | ACC |
| 046 | 0000 1010 1000 1101 | | 0 | | B-ONLY | RAM |
| 047 | 1000 0000 0001 1110 | | 1 | | 0001 | RADD HIGH ORDER PART |
| 050 | 0111 0000 0000 1111 | | 0 | RAM | A-ADD-C | ACC |
| 051 | 0000 1010 1000 1101 | | 0 | | B-ONLY | RAM |
| 052 | 1000 0000 0000 1110 | | 1 | | 0000 | RADD TEST CASE |
| 053 | 1000 0011 0000 1111 | | 1 | | 0060 | ACC GET INPUT BITS |
| 054 | 0111 1011 1000 1111 | | 0 | RAM | A-AND-B | ACC |
| 055 | 1000 0000 1111 1110 | | 1 | | 0017 | RADD |
| 056 | 0000 1010 1000 1101 | | 0 | | B-ONLY | RAM |
| 057 | 1000 1100 1110 1111 | | 1 | | 0316 | ACC BUILD ADDRESS |
| 060 | 0111 1001 0110 1011 | | 0 | RAM | A-ADD-B | PC |
| 061 | 1000 0000 0010 1110 | REV | 1 | | 0002 | RADD LOW ORDER PART |
| 062 | 0111 1111 0110 1111 | | 0 | RAM | A-SUB-1 | ACC |
| 063 | 0000 1010 1000 1101 | | 0 | | B-ONLY | RAM |
| 064 | 1000 0000 0001 1110 | | 1 | | 0001 | RADD HIGH ORDER PART |
| 065 | 0111 1111 0000 1111 | | 0 | RAM | A-SUB-C | ACC |
| 066 | 0000 1010 1000 1101 | | 0 | | B-ONLY | RAM |
| 067 | 1000 0000 0000 1110 | | 1 | | 0000 | RADD TEST CASE |
| 070 | 1000 0011 0000 1111 | | 1 | | 0060 | ACC GET INPUT BITS |
| 071 | 0111 1011 1000 1111 | | 0 | RAM | A-AND-B | ACC |
| 072 | 1000 0000 1111 1110 | | 1 | | 0017 | RADD |
| 073 | 0000 1010 1000 1101 | | 0 | | B-ONLY | RAM |
| 074 | 1000 1100 1111 1111 | | 1 | | 0317 | ACC BUILD ADDRESS |
| 075 | 0111 1001 0110 1011 | | 0 | RAM | A-ADD-B | PC |

| | | TEST CASE 0 - SW = 00 | | | | |
|---|---|---|---|---|---|---|
| 076 | 1000 0000 0101 1110 | FWD0 | 1 | | 0005 | RADD |
| 077 | 0111 1111 0110 1111 | | 0 | RAM | A-SUB-1 | ACC REVERSE COUNTER TOO |
| 100 | 0000 1010 1000 1101 | | 0 | | B-ONLY | RAM |
| 101 | 1000 0000 0100 1110 | | 1 | | 0004 | RADD |
| 102 | 0111 1111 0000 1111 | | 0 | RAM | A-SUB-C | ACC |
| 103 | 0000 1010 1000 1101 | | 0 | | B-ONLY | RAM |
| 104 | 1000 0000 0000 1110 | TOOA | 1 | | 0000 | RADD TEST ZERO REF |
| 105 | 0111 1100 0110 1111 | | 0 | RAM | SHIFT-A | ACC |
| 106 | 1001 0001 1001 1011 | | 1 | M | OUTP | PC NOT ZERO REF |
| 107 | 1000 0000 0001 1110 | | 1 | | 0001 | RADD RESET |
| 110 | 1000 0000 0000 1100 | | 1 | | 0000 | RAMI |

-continued

| | | | | | | | |
|---|---|---|---|---|---|---|---|
| | | TEST CASE 0 - SW = 00 | | | | | |
| 111 | 1000 0000 0000 1100 | | 1 | | 0000 | RAMI | |
| 112 | 1000 0000 0000 1100 | | 1 | | 0000 | RAMI | |
| 113 | 1000 1111 1111 1100 | | 1 | | 0377 | RAMI | |
| 114 | 1000 1111 1111 1101 | | 1 | | 0377 | RAM | |
| 115 | 1000 0001 1001 1011 | | 1 | | OUTP | PC | GO OUTPUT COUNTERS |
| 116 | 1000 0000 0101 1110 | REV0 | 1 | | 0005 | RADD | |
| 117 | 0111 0000 0010 1111 | | 0 | RAM | A-ADD-1 | ACC | REVERSE COUNTER TOO |
| 120 | 0000 1010 1000 1101 | | 0 | | B-ONLY | RAM | |
| 121 | 1000 0000 0100 1110 | | 1 | | 0004 | RADD | |
| 122 | 0111 0000 0000 1111 | | 0 | RAM | A-ADD-C | ACC | |
| 123 | 0000 1010 1000 1101 | | 0 | | B-ONLY | RAM | |
| 124 | 1000 0100 0100 1011 | | 1 | | TOOA | PC | GO TEST ZERO REF |

| | | | | | | | |
|---|---|---|---|---|---|---|---|
| | | TEST CASE 1 - SW = 0 | | | | | |
| 125 | 1000 0000 0001 1110 | FWD1 | 1 | | 0001 | RADD | TEST HIGH ORDER REF COUNTER |
| 126 | 1000 0000 0100 1111 | | 1 | | 0004 | ACC | |
| 127 | 0111 1011 1000 1111 | | 0 | RAM | A-AND-B | ACC | |
| 130 | 1000 0000 1111 1110 | | 1 | | 0017 | RADD | |
| 131 | 0000 1010 1000 1101 | | 0 | | B-ONLY | RAM | |
| 132 | 1000 0000 0100 1111 | | 1 | | 0004 | ACC | |
| 133 | 0111 0110 0010 1111 | | 0 | RAM | A-SUB-B | ACC | |
| 134 | 1100 0110 0100 1011 | | 1 E | | T01B | PC | |
| 135 | 1000 0000 0101 1110 | T01A | 1 | | 0005 | RADD | ADD TO 2ND COUNTER |
| 136 | 0111 0000 0010 1111 | | 0 | RAM | A-ADD-1 | ACC | |
| 137 | 0000 1010 1000 1101 | | 0 | | B-ONLY | RAM | |
| 140 | 1000 0000 0100 1110 | | 1 | | 0004 | RADD | |
| 141 | 0111 0000 0000 1111 | | 0 | RAM | A-ADD-C | ACC | |
| 142 | 0000 1010 1000 1101 | | 0 | | B-ONLY | RAM | |
| 143 | 1000 0110 1010 1011 | | 1 | | T01C | PC | |
| 144 | 1000 0000 0101 1110 | T01B | 1 | | 0005 | RADD | SUB FROM 2ND COUNTER |
| 145 | 0111 1111 0110 1111 | | 0 | RAM | A-SUB-1 | ACC | |
| 146 | 0000 1010 1000 1101 | | 0 | | B-ONLY | RAM | |
| 147 | 1000 0000 0100 1110 | | 1 | | 0004 | RADD | |
| 150 | 0111 1111 0000 1111 | | 0 | RAM | A-SUB-C | ACC | |
| 151 | 0000 1010 1000 1101 | | 0 | | B-ONLY | RAM | |
| 152 | 1000 0000 0011 1110 | T01C | 1 | | 0003 | RADD | |
| 153 | 1000 1111 1101 1111 | | 1 | | 0375 | ACC | CLEAR BOUNDARY BIT |
| 154 | 0111 1011 1000 1111 | | 0 | RAM | A-AND-B | ACC | |
| 155 | 0000 1010 1000 1101 | | 0 | | B-ONLY | RAM | |
| 156 | 1000 0000 0100 1110 | | 1 | | 0004 | RADD | |
| 157 | 1000 0000 0001 1111 | | 1 | | 0001 | ACC | TEST BOUNDARY |
| 160 | 0111 0110 0010 1111 | | 0 | RAM | A-SUB-B | ACC | |
| 161 | 1100 0111 1100 1011 | | 1 E | | T01E | PC | RIGHT RANGE |
| 162 | 1000 0000 0000 1110 | T01D | 1 | | 0000 | RADD | TEST ZERO REF |
| 163 | 0111 1100 0110 1111 | | 0 | RAM | SHIFT-A | ACC | |
| 164 | 1001 0001 1001 1011 | | 1 M | | OUTP | PC | NOT ZERO REF |
| 165 | 1000 0000 0001 1110 | | 1 | | 0001 | RADD | RESET |
| 166 | 1000 0000 0000 1100 | | 1 | | 0000 | RAM1 | |
| 167 | 1000 0000 0000 1100 | | 1 | | 0000 | RAM1 | |
| 170 | 1000 0000 0000 1100 | | 1 | | 0000 | RAM1 | |
| 171 | 1000 0000 0000 1100 | | 1 | | 0000 | RAM1 | |
| 172 | 1000 0000 0000 1101 | | 1 | | 0000 | RAM | |
| 173 | 1000 0001 1001 1011 | | 1 | | OUTP | PC | |
| 174 | 1000 0000 0101 1110 | T01E | 1 | | 0005 | RADD | |
| 175 | 1000 0010 0000 1111 | | 1 | | 0040 | ACC | |
| 176 | 0111 0110 0010 1111 | | 0 | RAM | A-SUB-B | ACC | |
| 177 | 1010 0111 0010 1011 | | 1 C | | T01D | PC | NO CARRY - NO BOUNDARY |
| 200 | 1000 0000 0011 1110 | | 1 | | 0003 | RADD | |
| 201 | 1000 0000 0010 1111 | | 1 | | 0002 | ACC | |
| 202 | 0111 1110 1000 1111 | | 0 | RAM | A-OR-B | ACC | SET BIT |
| 203 | 0000 1010 1000 1101 | | 0 | | B-ONLY | RAM | |
| 204 | 1000 0111 0010 1011 | | 1 | | T01D | PC | |
| 205 | 1000 0000 0001 1110 | REV1 | 1 | | 0001 | RADD | TEST HIGH ORDER REF COUNTER |
| 206 | 1000 0000 0100 1111 | | 1 | | 0004 | ACC | |
| 207 | 0111 1011 1000 1111 | | 0 | RAM | A-AND-B | ACC | |
| 210 | 1000 0000 1111 1110 | | 1 | | 0017 | RADD | |
| 211 | 0000 1010 1000 1101 | | 0 | | B-ONLY | RAM | |
| 212 | 1000 0000 0100 1111 | | 1 | | 0004 | ACC | |
| 213 | 0111 0110 0010 1111 | | 0 | RAM | A-SUB-B | ACC | |
| 214 | 1100 0101 1101 1011 | | 1 E | | T01A | PC | ADD TO 2ND COUNTER |
| 215 | 1000 0110 0100 1011 | | 1 | | T01B | PC | SUB FROM 2ND COUNTER |

| | | | | | | | |
|---|---|---|---|---|---|---|---|
| | | TEST CASE 2 - SW = 10 | | | | | |
| 216 | 1000 0000 0110 1110 | FWD2 | 1 | | 0006 | RADD | UPDATE SCALED COUNTER |
| 217 | 1000 0110 1001 1111 | | 1 | | 0151 | ACC | .410156 |
| 220 | 0111 1001 0110 1111 | | 0 | RAM | A-ADD-B | ACC | |
| 221 | 0000 1010 1000 1101 | | 0 | | B-ONLY | RAM | |
| 222 | 1000 0000 0101 1110 | | 1 | | 0005 | RADD | |
| 223 | 0111 0000 0000 1111 | | 0 | RAM | A-ADD-C | ACC | |
| 224 | 0000 1010 1000 1101 | | 0 | | B-ONLY | RAM | |
| 225 | 1000 0000 0100 1110 | | 1 | | 0004 | RADD | |
| 226 | 0111 0000 0000 1111 | | 0 | RAM | A-ADD-C | ACC | |
| 227 | 0000 1010 1000 1101 | | 0 | | B-ONLY | RAM | |
| 230 | 1000 0000 0000 1110 | T02A | 1 | | 0000 | RADD | TEST ZERO REF |
| 231 | 0111 1100 0110 1111 | | 0 | RAM | SHIFT-A | ACC | |

-continued

| | | TEST CASE 2 - SW = 10 | | | | | |
|---|---|---|---|---|---|---|---|
| 232 | 1001 0001 1001 1011 | | 1 | M | OUTP | PC | NOT ZERO REF |
| 233 | 1000 0000 0001 1110 | | 1 | | 0001 | RADD | RESET |
| 234 | 1000 0000 0000 1100 | | 1 | | 0000 | RAM1 | |
| 235 | 1000 0000 0000 1100 | | 1 | | 0000 | RAM1 | |
| 236 | 1000 0000 0000 1100 | | 1 | | 0000 | RAM1 | |
| 237 | 1000 0000 0000 1100 | | 1 | | 0000 | RAM1 | |
| 240 | 1000 0000 0000 1100 | | 1 | | 0000 | RAM1 | |
| 241 | 1000 0000 0000 1101 | | 1 | | 0000 | RAM | |
| 242 | 1000 0001 1001 1011 | | 1 | | OUTP | PC | GO OUTPUT COUNTERS |
| 243 | 1000 0000 0110 1110 | REV2 | 1 | | 0006 | RADD | UPDATE SCALED COUNTER |
| 244 | 1000 0110 1001 1111 | | 1 | | 0151 | ACC | .410156 |
| 245 | 0111 0110 0010 1111 | | 0 | RAM | A-SUB-B | ACC | |
| 246 | 0000 1010 1000 1101 | | 0 | | B-ONLY | RAM | |
| 247 | 1000 0000 0101 1110 | | 1 | | 0005 | RADD | |
| 250 | 0111 1111 0000 1111 | | 0 | RAM | A-SUB-C | ACC | |
| 251 | 0000 1010 1000 1101 | | 0 | | B-ONLY | RAM | |
| 252 | 1000 0000 0100 1110 | | 1 | | 0004 | RADD | |
| 253 | 0111 1111 0000 1111 | | 0 | RAM | A-SUB-C | ACC | |
| 254 | 0000 1010 1000 1101 | | 0 | | B-ONLY | RAM | |
| 255 | 1000 1001 1000 1011 | | 1 | | T02A | PC | GO TEST ZERO REF |

| | | TEST CASE 3 - SW = 11 | | | | | |
|---|---|---|---|---|---|---|---|
| 256 | 1000 0000 0100 1110 | FWD3 | 1 | | 0004 | RADD | GET HIGH ORDER BIT |
| 257 | 1000 0000 0010 1111 | | 1 | | 0002 | ACC | |
| 260 | 0111 1011 1000 1111 | | 0 | RAM | A-AND-B | ACC | |
| 261 | 1000 0000 1111 1110 | | 1 | | 0017 | RADD | |
| 262 | 0000 1010 1000 1101 | | 0 | | B-ONLY | RAM | |
| 263 | 1000 0000 0011 1110 | | 1 | | 0003 | RADD | CLEAR BIT 1 |
| 264 | 1000 1111 1101 1111 | | 1 | | 0375 | ACC | |
| 265 | 0111 1011 1000 1111 | | 0 | RAM | A-AND-B | ACC | |
| 266 | 1000 0000 1111 1110 | | 1 | | 0017 | RADD | |
| 267 | 0111 1110 1000 1111 | | 0 | RAM | A-OR-B | ACC | SET 180 DEGREE SWITCH |
| 270 | 1000 0000 0011 1110 | | 1 | | 0003 | RADD | |
| 271 | 0000 1010 1000 1101 | | 0 | | B-ONLY | RAM | |
| 272 | 1000 1000 1110 1011 | | 1 | | FWD2 | PC | |
| 273 | 1000 0000 0100 1110 | REV3 | 1 | | 0004 | RADD | GET HIGH ORDER BIT |
| 274 | 1000 0000 0010 1111 | | 1 | | 0002 | ACC | |
| 275 | 0111 1011 1000 1111 | | 0 | RAM | A-AND-B | ACC | |
| 276 | 1000 0000 1111 1110 | | 1 | | 0017 | RADD | |
| 277 | 0000 1010 1000 1101 | | 0 | | B-ONLY | RAM | |
| 300 | 1000 0000 0011 1110 | | 1 | | 0003 | RADD | CLEAR BIT 1 |
| 301 | 1000 1111 1101 1111 | | 1 | | 0375 | ACC | |
| 302 | 0111 1011 1000 1111 | | 0 | RAM | A-AND-B | ACC | |
| 303 | 1000 0000 1111 1110 | | 1 | | 0017 | RADD | |
| 304 | 0111 1110 1000 1111 | | 0 | RAM- | A-OR-B | ACC | SET 180 DEGREE SWITCH |
| 305 | 1000 0000 0011 1110 | | 1 | | 0003 | RADD | |
| 306 | 0000 1010 1000 1101 | | 0 | | B-ONLY | RAM | |
| 307 | 1000 1010 0011 1011 | | 1 | | REV2 | PC | |

| | DISPATCH LOCATIONS FOR TEST CASES | | | | |
|---|---|---|---|---|---|
| 316 | | 2 | 0316 | | |
| 316 | 1000 0011 1110 1011 | 1 | FWD0 | PC | |
| 317 | 1000 0100 1110 1011 | 1 | REV0 | PC | |
| 336 | | 2 | 0336 | | |
| 336 | 1000 0101 0101 1011 | 1 | FWD1 | PC | |
| 337 | 1000 1000 0101 1011 | 1 | REV1 | PC | |
| 356 | | 2 | 0356 | | |
| 356 | 1000 1000 0110 1011 | 1 | FWD2 | PC | |
| 357 | 1000 1010 0011 1011 | 1 | REV2 | PC | |
| 376 | | 2 | 0376 | | |
| 376 | 1000 1010 1110 1011 | 1 | FWD3 | PC | |
| 377 | 1000 1011 1011 1011 | 1 | REV3 | PC | |
| | | 3 | END CARD | | |

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A system for providing an output indication of relative position in response to signals from a position encoder comprising:
   means for receiving signals from said encoder;
   means for producing a selectable transformation in said received signals in response to a selection control;
   means for providing the control of said transforming means and including:
   means for defining a sequence of steps; and
   means operative in association with said transformation producing means and responsive to the defined sequence of steps for providing said selection control to select at least one transformation for at least one corresponding step in the defined sequence; and
   means for providing an output indication representative of the transformed received signals.

2. The system of claim 1 wherein said means for defining a sequence of steps includes a counter.

3. The system of claim 1 wherein said transforming means includes an arithmetic logic unit.

4. The system of claim 3 wherein said means for providing said selection control further includes:
   a read-only-memory;
   said read-only-memory containing a matrix of binary information;
   means for providing signals to represent a portion of the binary information of said matrix in response to the defined sequence; and
   means responsive to the signals provided from said matrix of binary information and operative in association with said arithmetic logic unit for producing the transformation on said received signals.

5. The system of claim 1 wherein said means for providing said selection control further includes:
means for providing a plurality of selection controls in response to said defined sequence of steps to produce a scale factor change as said transformations whereby said output indication represents a scale factor change in the signals received from said encoder.

6. The system of claim 1 wherein said means for providing said selection control further includes:
means operative in response to said defined sequence of steps to identify a predetermined range of values in said received encoder signals;
means operative in response to the identified range of values in the received encoder signals for providing a representation thereof in said output indication.

7. A system for providing selectable format output indications of relative position including:
an encoder having a plurality of output signals representing relative position according to a predetermined digital format;
means for storing a sequence of encoder output signals representing relative positions;
a counter providing a sequence of identified states;
a first memory responsive to the states of said counter to provide output signals representing predetermined memory information;
a second memory;
a digital transformation circuit operative in response to a selection control to provide a corresponding digital logic function;
first switch means responsive to a first set of memory output signals to select a signal source from among said encoder, said second memory and said counter for application of signals therefrom to said transformation circuit;
a latch memory having signals stored therein applied to said transformation circuit;
means responsive to a second set of memory output signals to control operation of said transformation circuit in association with said counter, second memory and latch memory to perform corresponding transformations on said encoder output signals;
said second set of memory output signals defining transformations which provide a scale factor change and identifies a predetermined range in said encoder output signals;
an output register;
an output signal path connected to said output register, said latch memory, said counter, said second memory, and said latch memory;
second switch means responsive to a third set of memory output signals and responsive to input data from said transformation circuit and a fourth set of memory output signals for selecting input data for application to said output signal path; and
means responsive to a fifth set of memory output signals for identifying which of said output register, counter, random access memory and latch memory are to receive data from said second switch means.

8. An encoder system for providing an output indication of relative position comprising:
an incremental encoder providing an output signal representative of elemental changes in position measured by said encoder;
means responsive to said signals from said encoder for providing an output indication of absolute position measured by said encoder and comprising:
means for providing one of a set of plural arithmetic operations on said encoder signal; and
read-only-memory means for defining a sequence of selected arithmetic operations to be performed by said providing means on said encoder signals to provide said output indication.

9. The encoder system of claim 8 wherein said means for providing an arithmetic operation further includes:
an arithmetic logic unit;
an accumulator operative in association with said arithmetic logic unit;
a memory for operation with said arithmetic logic unit; and
an output register for receiving data from said arithmetic logic unit to provide said output indication.

10. The encoder system of claim 8 wherein said sequence defining means further includes means for operating said arithmetic operation providing means to provide an output indication representative of said encoder being within predetermined portions of its range of operation.

* * * * *

UNITED STATES PATENT AND TRADEMARK OFFICE
CERTIFICATE OF CORRECTION

PATENT NO. : 4,123,750
DATED : October 31, 1978
INVENTOR(S) : David E. Leney et al It is certified that error appears in the above-identified patent and that said Letters Patent are hereby corrected as shown below:

Column 3, lines 9-10, "$\bar{A}b+\lambda\bar{B}a+A\bar{b}+\bar{B}\bar{a}$--" should read --$\bar{A}b+Ba+A\bar{b}+\bar{B}\bar{a}$--.

*Signed and Sealed this*

*Eighteenth* Day of *September 1979*

[SEAL]

Attest:

LUTRELLE F. PARKER

*Attesting Officer*     *Acting Commissioner of Patents and Trademarks*